United States Patent
Wu et al.

(10) Patent No.: US 11,677,321 B2
(45) Date of Patent: Jun. 13, 2023

(54) POWER CONVERTER HAVING SLEW RATE CONTROLLING MECHANISM

(71) Applicant: ANPEC ELECTRONICS CORPORATION, Hsinchu (TW)

(72) Inventors: Tse-Hsu Wu, Hsinchu (TW); Cheng-Han Wu, Hsinchu (TW); Fu-Chuan Chen, Hsinchu (TW); Yun-Chiang Chang, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 136 days.

(21) Appl. No.: 17/479,136

(22) Filed: Sep. 20, 2021

(65) Prior Publication Data
US 2022/0393592 A1  Dec. 8, 2022

(30) Foreign Application Priority Data
Jun. 3, 2021  (TW) ................................. 110120109

(51) Int. Cl.
*H02M 3/158* (2006.01)
*H02M 1/00* (2006.01)
*H03K 17/693* (2006.01)
*H03K 17/16* (2006.01)

(52) U.S. Cl.
CPC ......... *H02M 3/158* (2013.01); *H02M 1/0029* (2021.05); *H03K 17/693* (2013.01); *H02M 1/0003* (2021.05); *H03K 17/162* (2013.01); *H03K 2217/0063* (2013.01); *H03K 2217/0072* (2013.01); *H03K 2217/0081* (2013.01)

(58) Field of Classification Search
None
See application file for complete search history.

(56) References Cited

U.S. PATENT DOCUMENTS

| 9,148,054 | B2* | 9/2015 | Chiang | H03K 17/063 |
| 9,847,722 | B2* | 12/2017 | Chiang | H02M 3/156 |
| 2017/0250609 | A1* | 8/2017 | Zhang | H02M 3/158 |
| 2020/0266700 | A1* | 8/2020 | Ruan | H03K 5/12 |
| 2021/0296986 | A1* | 9/2021 | Wu | H02M 3/157 |
| 2022/0166320 | A1* | 5/2022 | Brambilla | H02M 3/158 |

* cited by examiner

*Primary Examiner* — Matthew V Nguyen
(74) *Attorney, Agent, or Firm* — Li & Cai Intellectual Property (USA) Office

(57) ABSTRACT

A power converter having a slew rate controlling mechanism is provided. A first terminal of a high-side switch is coupled to an input voltage. A first terminal of a low-side switch is connected to a second terminal of the high-side switch. A second terminal of a first capacitor is connected to a node between the second terminal of the high-side switch and the first terminal of the low-side switch. A first terminal of an inductor is connected to the second terminal of the first capacitor and to the node. A first terminal of a second capacitor is connected to a second terminal of the inductor. A second terminal of the second capacitor is grounded. An input terminal of a current controlling device is connected to a power output terminal of a high-side buffer. An output terminal of the current controlling device is connected to the node.

20 Claims, 8 Drawing Sheets

POWER CONVERTER HAVING SLEW RATE CONTROLLING MECHANISM

CROSS-REFERENCE TO RELATED PATENT APPLICATION

This application claims the benefit of priority to Taiwan Patent Application No. 110120109, filed on Jun. 3, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having a slew rate controlling mechanism.

BACKGROUND OF THE DISCLOSURE

Power converters are essential for voltage adjustment of electronic devices. Based on different power requirements of the electronic devices, various types of the power converters have been developed. It should be understood that high noise is generated when a high-side switch and a low-side switch of the power converter are switched at a high frequency. Consequently, when the conventional power converter is applied to the electronic device such as a cell phone, signal transmission or other specific operations between the power converter and the electronic device can be affected by the high noise of the power converter.

SUMMARY OF THE DISCLOSURE

In response to the above-referenced technical inadequacies, the present disclosure provides a power converter having a slew rate controlling mechanism. The power converter having the slew rate controlling mechanism includes a high-side switch, a low-side switch, a first capacitor, an inductor, a second capacitor, a high-side buffer and a current controlling device. A first terminal of the high-side switch is coupled to an input voltage. A first terminal of the low-side switch is connected to a second terminal of the high-side switch. A second terminal of the low-side switch is grounded. The first capacitor has a first terminal and a second terminal. The second terminal of the first capacitor is connected to a node between the second terminal of the high-side switch and the first terminal of the low-side switch. A first terminal of the inductor is connected to the second terminal of the first capacitor. The first terminal of the inductor is connected to the node between the second terminal of the high-side switch and the first terminal of the low-side switch. A first terminal of the second capacitor is connected to a second terminal of the inductor. A second terminal of the second capacitor is grounded. A signal input terminal of the high-side buffer is connected to an output terminal of a driver circuit. A signal output terminal of the high-side buffer is connected to a control terminal of the high-side switch. A power input terminal of the high-side buffer is connected to the first terminal of the first capacitor and coupled to a common voltage. An input terminal of the current controlling device is connected to a power output terminal of the high-side buffer. An output terminal of the current controlling device is connected to the node between the second terminal of the high-side switch and the first terminal of the low-side switch.

In certain embodiments, the power converter having the slew rate controlling mechanism further includes a resistor. A first terminal of the resistor is connected to the power input terminal of the high-side buffer and coupled to the common voltage. A second terminal of the resistor is connected to the first terminal of the first capacitor.

In certain embodiments, the power converter having the slew rate controlling mechanism further includes a diode. An anode of the diode is coupled to the common voltage. A cathode of the diode is connected to the power input terminal of the high-side buffer.

In certain embodiments, the power converter having the slew rate controlling mechanism further includes a low-side buffer. A signal input terminal of the low-side buffer is connected to the output terminal of the driver circuit. A signal output terminal of the low-side buffer is connected to a control terminal of the low-side switch.

In certain embodiments, the current controlling device includes a resistor. A first terminal of the resistor is used as the input terminal of the current controlling device. A second terminal of the resistor is used as the output terminal of the current controlling device.

In certain embodiments, the current controlling device includes a plurality of resistors connected to each other in series. A terminal of one of the plurality of resistors is used as the input terminal of the current controlling device. A terminal of another one of the plurality of resistors is used as the output terminal of the current controlling device.

In certain embodiments, the current controlling device includes a plurality of resistors connected to each other in parallel. A first terminal of each of the resistors is used as the input terminal of the current controlling device. A second terminal of each of the resistors is used as the output terminal of the current controlling device.

In certain embodiments, the current controlling device includes a plurality of resistors and a plurality of switch components. A first terminal of each of the resistors is used as the input terminal of the current controlling device. Second terminals of the resistors are respectively connected to first terminals of the switch components. A second terminal of each of the switch components is used as the output terminal of the current controlling device.

In certain embodiments, the current controlling device further includes a resistor controller. The resistor controller is connected to a control terminal of each of the plurality of switch components. The resistor controller is configured to control each of the plurality of switch components.

In certain embodiments, the current controlling device includes an error amplifier, a transistor and a resistor. A first terminal of the transistor is used as the input terminal of the current controlling device. A second terminal of the transistor is connected to a first terminal of the resistor. A second terminal of the resistor is used as the output terminal of the current controlling device. A first input terminal of the error amplifier is coupled to a reference voltage. A second input terminal of the error amplifier is connected to a node between the second terminal of the transistor and the first terminal of the resistor. An output terminal of the error amplifier is connected to a control terminal of the transistor.

In another aspect, the present disclosure provides a power converter having a slew rate controlling mechanism. The power converter having the slew rate controlling mechanism includes a high-side switch, a low-side switch, an inductor, a capacitor, a high-side buffer and a first current controlling device. A first terminal of the high-side switch is coupled to an input voltage. A first terminal of the low-side switch is connected to a second terminal of the high-side switch. A second terminal of the low-side switch is grounded. A first terminal of the inductor is connected to a node between the second terminal of the high-side switch and the first terminal of the low-side switch. A first terminal of the capacitor is connected to a second terminal of the inductor. A second terminal of the capacitor is grounded. A signal input terminal of the high-side buffer is connected to an output terminal of a driver circuit. A signal output terminal of the high-side buffer is connected to a control terminal of the high-side switch. A power output terminal of the high-side buffer is grounded. An output terminal of the first current controlling device is connected to a power input terminal of the high-side buffer. An input terminal of the first current controlling device is coupled to a common voltage.

In certain embodiments, the power converter having the slew rate controlling mechanism further includes a low-side buffer. A signal input terminal of the low-side buffer is connected to the output terminal of the driver circuit. A signal output terminal of the low-side buffer is connected to a control terminal of the low-side switch.

In certain embodiments, the first current controlling device includes a resistor. A first terminal of the resistor is used as the input terminal of the first current controlling device. A second terminal of the resistor is used as the output terminal of the first current controlling device.

In certain embodiments, the first current controlling device includes a plurality of resistors connected to each other in series. A terminal of one of the plurality of resistors is used as the input terminal of the first current controlling device. A terminal of another one of the plurality of resistors is used as the output terminal of the first current controlling device.

In certain embodiments, the first current controlling device includes a plurality of resistors connected to each other in parallel. A first terminal of each of the resistors is used as the input terminal of the first current controlling device. A second terminal of each of the resistors is used as the output terminal of the first current controlling device.

In certain embodiments, the first current controlling device includes a plurality of resistors and a plurality of switch components. A first terminal of each of the plurality of resistors is used as the input terminal of the first current controlling device. Second terminals of the plurality of resistors are respectively connected to first terminals of the plurality of switch components. A second terminal of each of the plurality of switch components is used as the output terminal of the first current controlling device.

In certain embodiments, the first current controlling device includes a plurality of resistors and a plurality of switch components. A first terminal of each of the switch components is used as the input terminal of the first current controlling device. Second terminals of the plurality of switch components are respectively connected to first terminals of the plurality of resistors. A second terminal of each of the plurality of resistors is used as the output terminal of the first current controlling device.

In certain embodiments, the first current controlling device further includes a resistor controller. The resistor controller is connected to a control terminal of each of the plurality of switch components. The resistor controller is configured to control each of the plurality of switch components.

In certain embodiments, the first current controlling device includes an error amplifier, a transistor and a resistor. A first terminal of the transistor is used as the input terminal of the first current controlling device. A second terminal of the transistor is connected to a first terminal of the resistor. A second terminal of the resistor is used as the output terminal of the first current controlling device. A first input terminal of the error amplifier is coupled to a reference voltage. A second input terminal of the error amplifier is connected to a node between the second terminal of the transistor and the first terminal of the resistor. An output terminal of the error amplifier is connected to a control terminal of the transistor.

In certain embodiments, the power converter having the slew rate controlling mechanism further includes a second current controlling device disposed between the high-side buffer and a ground. An input terminal of the second current controlling device is connected to the power output terminal of the high-side buffer. An output terminal of the second current controlling device is grounded.

As described above, the present disclosure provides the power converter having the slew rate controlling mechanism, which includes the current controlling device that can provide different resistances according to different actual requirements. As a result, a slew rate of a falling edge of each of waveforms of the voltage signal of the node between the second terminal of the high-side switch and the first terminal of the low-side switch can be adjusted, or a slew rate of the control terminal of the high-side switch can be adjusted. Therefore, a noise of the power converter can be reduced to a desired noise level, and the power converter can operate at a desired efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
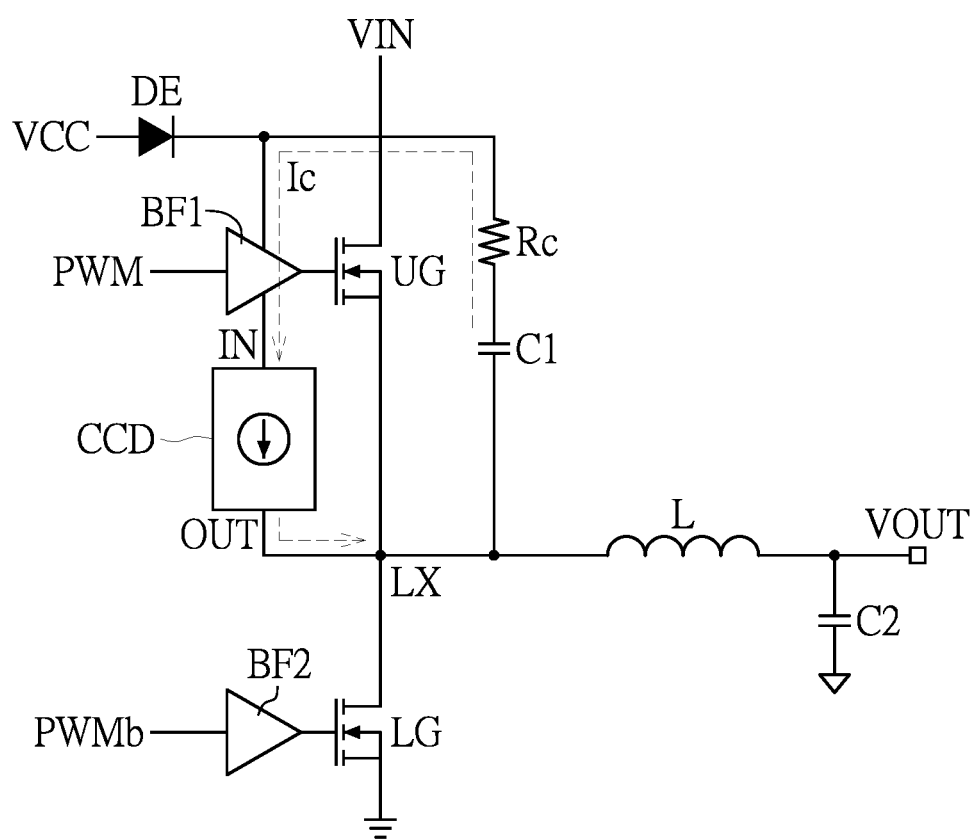
FIG. 1 is a circuit layout diagram of a power converter having a slew rate controlling mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a circuit layout diagram of a power converter having a slew rate controlling mechanism according to a first embodiment of the present disclosure.

In the embodiment, the power converter may include a high-side switch UG, a low-side switch LG, a first capacitor C1, an inductor L, a second capacitor C2, a current controlling device CCD, a high-side buffer BF1 and a low-side buffer BF2. In the embodiment, the high-side switch UG may be an re-channel metal oxide semiconductor field effect transistor (NMOSFET).

A first terminal of the high-side switch UG may be coupled to an input voltage VIN. A second terminal of the high-side switch UG may be connected to a first terminal of the low-side switch LG. A second terminal of the low-side switch LG may be grounded. A node LX between the second terminal of the high-side switch UG and the first terminal of the low-side switch LG may be connected to a first terminal of the inductor L. A second terminal of the inductor L is connected to a first terminal of the second capacitor C2. A second terminal of the second capacitor C2 is grounded.

A control terminal of the high-side switch UG and a control terminal of the low-side switch LG may be connected to a driver circuit (not shown in figures). The driver circuit receives a high-side driving signal PWM and a low-side driving signal PWMb from the driver circuit. In the embodiment, the high-side driving signal PWM and the low-side driving signal PWMb may be pulse width modulation signals, but the present disclosure is not limited thereto.

A first terminal of the first capacitor C1 may be coupled to a common voltage VCC. A second terminal of the first capacitor C1 may be connected to the node LX between the second terminal of the high-side switch UG and the first terminal of the low-side switch LG. The second terminal of the first capacitor C1 may be connected to the first terminal of the inductor L.

An input terminal IN of the current controlling device CCD may be connected to a power output terminal of the high-side buffer BF1. An output terminal OUT of the current controlling device CCD may be connected to the node LX between the second terminal of the high-side switch UG and the first terminal of the low-side switch LG. The output terminal OUT of the current controlling device CCD may be connected to the second terminal of the first capacitor C1.

A signal input terminal of the low-side buffer BF2 may be connected to an output terminal of the driver circuit (not shown in figures). The signal input terminal of the low-side buffer BF2 may receive the low-side driving signal PWMb from the driver circuit. A signal output terminal of the low-side buffer BF2 may be connected to the control terminal of the low-side switch LG. The low-side buffer BF2 may be configured to buffer the low-side driving signal PWMb that is outputted from the driver circuit to the low-side switch LG.

A signal input terminal of the high-side buffer BF1 may be connected to the output terminal of the driver circuit (not shown in figures). The signal input terminal of the high-side buffer BF1 may receive the high-side driving signal PWM from the driver circuit. A signal output terminal of the high-side buffer BF1 may be connected to the control terminal of the high-side switch UG. A power input terminal of the high-side buffer BF1 may be connected to the first terminal of the first capacitor C1. The power output terminal of the high-side buffer BF1 may be connected to the input terminal IN of the current controlling device CCD. The high-side buffer BF1 may be configured to buffer the high-side driving signal PWM that is outputted from the driver circuit to the high-side switch UG.

If necessary, the power converter of the embodiment may further include a resistor Rc. A first terminal of the resistor Rc may be coupled to the common voltage VCC. If the power converter includes the resistor Rc, the power input terminal of the high-side buffer BF1 may be connected to a first terminal of the resistor Rc, and a second terminal of the resistor Rc may be connected to the first terminal of the first capacitor C1.

The power converter of the embodiment may further include a diode DE, thereby preventing a discharge current of the first capacitor C1 from recharging the common voltage VCC. An anode of the diode DE may be coupled to the common voltage VCC. A cathode of the diode DE may be connected to the first terminal of the first capacitor C1 (through the resistor Rc).

Second Embodiment

Figure 2:
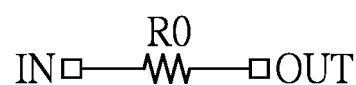
FIG. 2 is a circuit layout diagram of a current controlling device of a power converter having a slew rate controlling mechanism according to a second embodiment of the present disclosure.

Reference is made to FIG. 2, which is a circuit layout diagram of a current controlling device of a power converter having a slew rate controlling mechanism according to a second embodiment of the present disclosure.

In the embodiment, the current controlling device (such as the current controlling device CCD shown in FIG. 1, a first current controlling device CCD1 shown in FIG. 10 or FIG. 11, or a second current controlling device CCD2 shown in FIG. 11) of the power converter may include a resistor R0 shown in FIG. 2. A first terminal of the resistor R0 may be as the input terminal IN of the current controlling device. That is, the first terminal of the resistor R0 shown in FIG. 2 may be connected to the power output terminal of the high-side buffer BF1 shown in FIG. 1, or be coupled to the common voltage VCC shown in FIG. 10 or FIG. 11.

A second terminal of the resistor R0 may be as the output terminal OUT of the current controlling device. That is, the second terminal of the resistor R0 shown in FIG. 2 may be connected to the node LX shown in FIG. 1, or may be connected to the power input terminal of the high-side buffer BF1 shown in FIG. 10 or FIG. 11.

The second terminal of the resistor R0 may be connected to the node LX between the second terminal of the high-side switch UG and the first terminal of the low-side switch LG. The second terminal of the resistor R0 may be connected to the second terminal of the first capacitor C1. The first capacitor C1 may be discharged to output a discharge current Ic that flows to the input terminal IN of the current controlling device CCD. The current controlling device CCD may be configured to reduce the discharge current Ic, and the reduced discharge current Ic may flow toward the node LX.

Third Embodiment

Figure 3:
FIG. 3 is a circuit layout diagram of a current controlling device of a power converter having a slew rate controlling mechanism according to a third embodiment of the present disclosure.

Reference is made to FIG. 3, which is a circuit layout diagram of a current controlling device of a power converter having a slew rate controlling mechanism according to a third embodiment of the present disclosure.

In the embodiment, the current controlling device (such as the current controlling device CCD shown in FIG. 1, the first current controlling device CCD1 shown in FIG. 10 or FIG. 11, or the second current controlling device CCD2 shown in FIG. 11) of the power converter may include a plurality of resistors Rs1 to Rsn shown in FIG. 3, in which a number of the resistors included in the first current controlling device CCD1 is represented by n and may be any suitable integer value. It should be understood that, the present disclosure is not limited to the number of the resistors included in the first current controlling device and resistances of the resistors.

The resistors Rs1 to Rsn may be connected to each other in series. A terminal of the resistor Rs1 may be as the input terminal IN of the current controlling device. That is, a first terminal of the resistor Rs1 shown in FIG. 3 may be connected to the power output terminal of the high-side buffer BF1 shown in FIG. 1, or be coupled to the common voltage VCC shown in FIG. 10 or FIG. 11.

A second terminal of the resistor Rs1 may be connected to a first terminal of the resistor Rs2. A second terminal of the resistor Rs2 may be connected to a first terminal of the resistor Rs3. A second terminal of the resistor Rs3 may be connected to a first terminal of the resistor Rs4. The remaining resistors Rs3 to Rsn are sequentially arranged and connected to each other in series.

The second terminal of the resistor Rs2 may be as the output terminal OUT of the current controlling device. That is, the second terminal of the resistor Rs2 may be connected to the node LX between the second terminal of the high-side switch UG and the first terminal of the low-side switch LG as shown in FIG. 1, or be connected to the power input terminal of the high-side buffer BF1 shown in FIG. 10 or FIG. 11.

Fourth Embodiment

Figure 4:
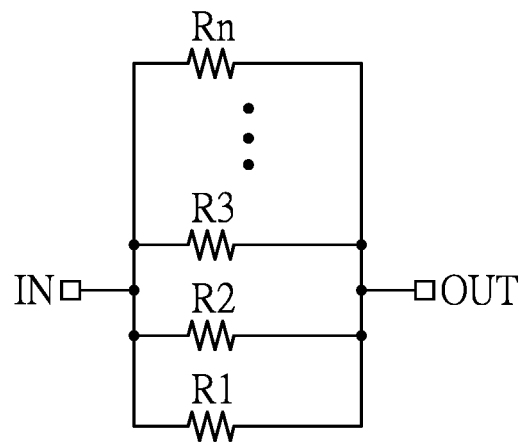
FIG. 4 is a circuit layout diagram of a current controlling device of a power converter having a slew rate controlling mechanism according to a fourth embodiment of the present disclosure.

Reference is made to FIG. 4, which is a circuit layout diagram of a current controlling device of a power converter having a slew rate controlling mechanism according to a fourth embodiment of the present disclosure.

In the embodiment, the current controlling device (such as the current controlling device CCD shown in FIG. 1, the first current controlling device CCD1 shown in FIG. 10 or FIG. 11, or the second current controlling device CCD2 shown in FIG. 11) of the power converter may include a plurality of resistors R1 to Rn shown in FIG. 4. The resistors R1 to Rn may be connected to each other in parallel.

A first terminal of each of the resistors R1 to Rn may be as the input terminal IN of the current controlling device. The first terminal of each of the resistors R1 to Rn shown in FIG. 4 may be connected to the power output terminal of the high-side buffer BF1 shown in FIG. 1, or be coupled to the common voltage VCC shown in FIG. 10 or FIG. 11.

A second terminal of each of the resistors R1 to Rn may be as the output terminal OUT of the current controlling device. That is, the second terminal of each of the resistors R1 to Rn shown in FIG. 4 may be connected to the node LX between the second terminal of the high-side switch UG and the first terminal of the low-side switch LG as shown in FIG. 1, and be connected to the second terminal of the first capacitor C1.

Fifth Embodiment

Figure 5:
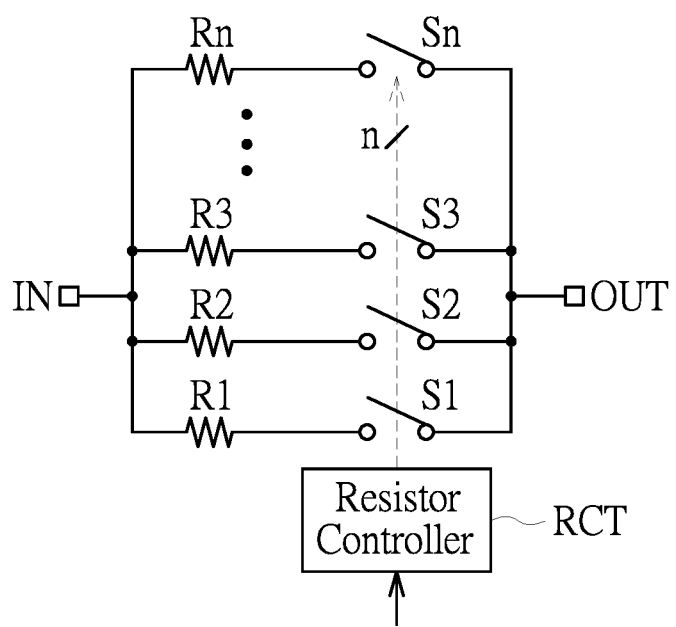
FIG. 5 is a circuit layout diagram of a current controlling device of a power converter having a slew rate controlling mechanism according to a fifth embodiment of the present disclosure.

Reference is made to FIG. 5, which is a circuit layout diagram of a current controlling device of a power converter having a slew rate controlling mechanism according to a fifth embodiment of the present disclosure.

In the embodiment, the current controlling device (such as the current controlling device CCD shown in FIG. 1, the first current controlling device CCD1 shown in FIG. 10 or FIG. 11, or the second current controlling device CCD2 shown in FIG. 11) of the power converter may include a plurality of resistors R1 to Rn and a plurality of switch components S1 to Sn as shown in FIG. 5.

A first terminal of each of the resistors R1 to Rn shown in FIG. 5 may be connected to the power output terminal of the high-side buffer BF1 shown in FIG. 1.

Second terminals of the resistors R1 to Rn may be respectively connected to first terminals of the switch components S1 to Sn. A second terminal of each of the switch components S1 to Sn may be as the output terminal OUT of the current controlling device.

Figure 10:
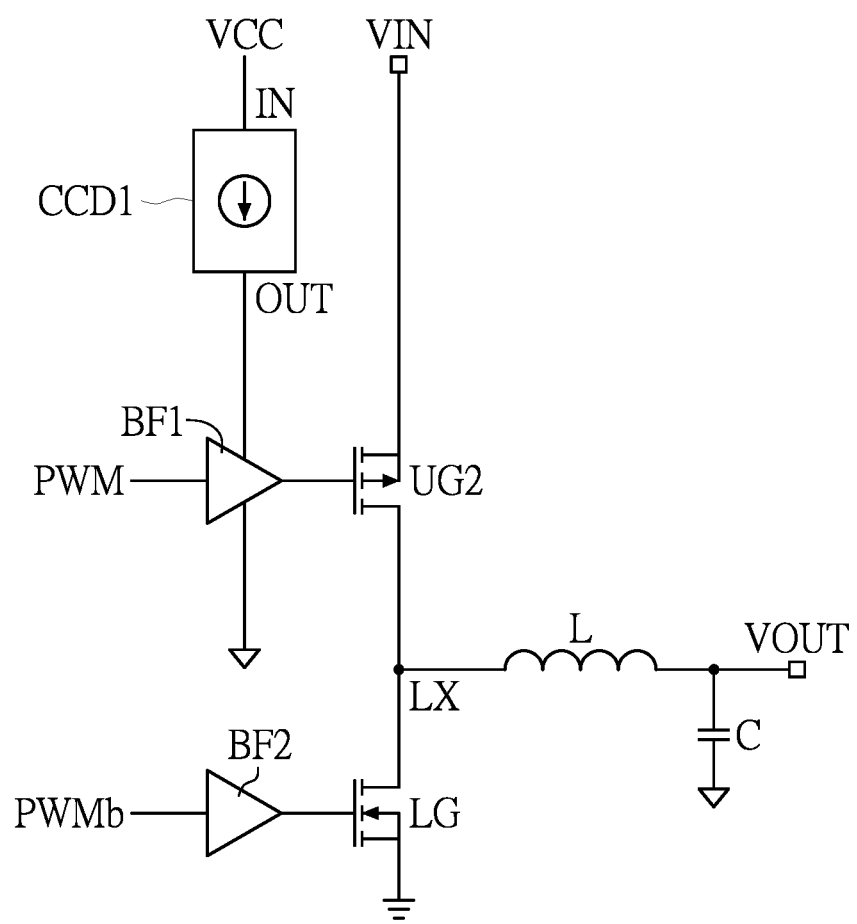
FIG. 10 is a circuit layout diagram of a power converter with a slew rate controlling mechanism according to an eighth embodiment of the present disclosure.
Figure 11:
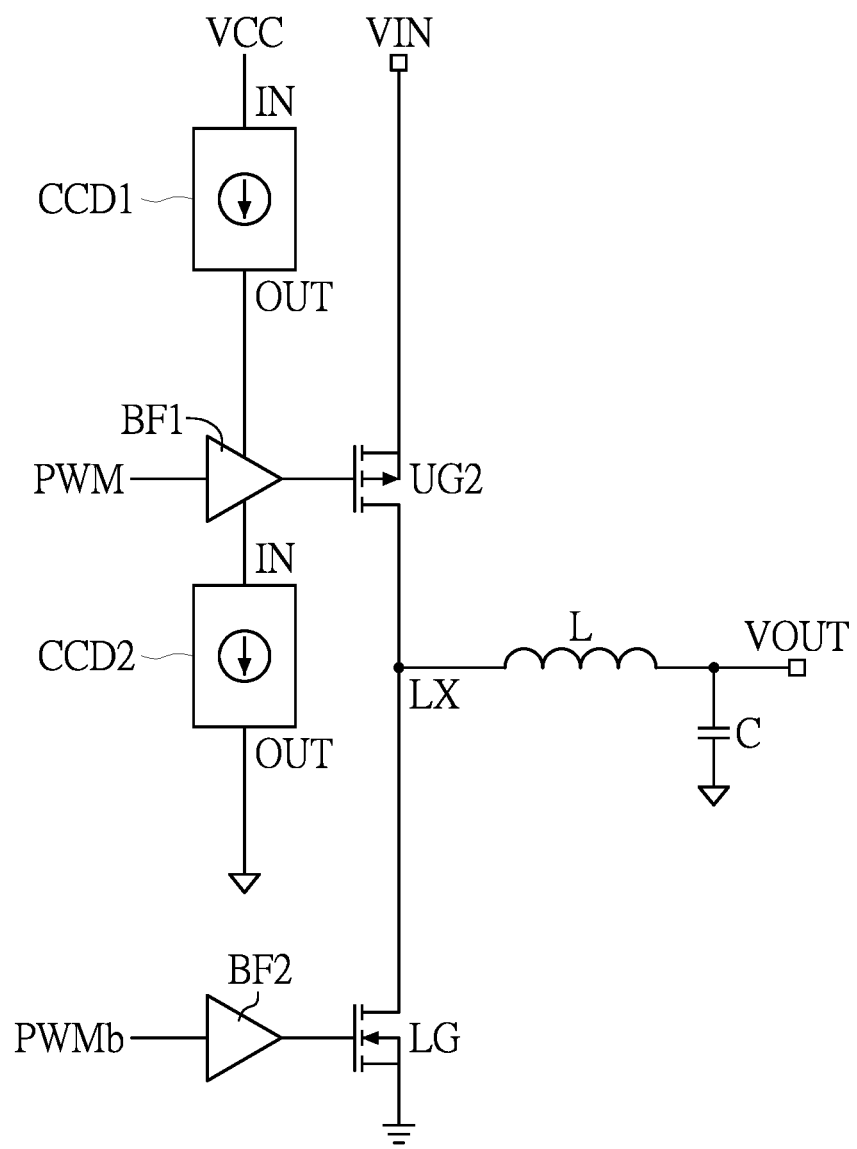
FIG. 11 is a circuit layout diagram of a power converter with a slew rate controlling mechanism according to a ninth embodiment of the present disclosure.

That is, the second terminal of each of the switch components S1 to Sn shown in FIG. 5 may be connected to the node LX between the second terminal of the high-side switch UG and the first terminal of the low-side switch LG as shown in FIG. 1, or be connected to the power input terminal of the high-side buffer BF1 shown in FIG. 10 or FIG. 11.

The current controlling device (such as the current controlling device CCD shown in FIG. 1) may further include a resistor controller RCT. The resistor controller RCT may be connected to a control terminal of each of the switch components S1 to Sn. The resistor controller RCT may be configured to output a plurality of switch controlling signals respectively to the switch components S1 to Sn to control the switch components S1 to Sn. A number of the switch controlling signals outputted by the resistor controller RCT may be n.

The resistor controller RCT may turn on one or more of the plurality of switch components S1 to Sn such that the current controlling device provides different resistances to reduce the discharge current Ic of the first capacitor C1 shown in FIG. 1 to different current values, according to actual requirements.

Sixth Embodiment

Figure 6:
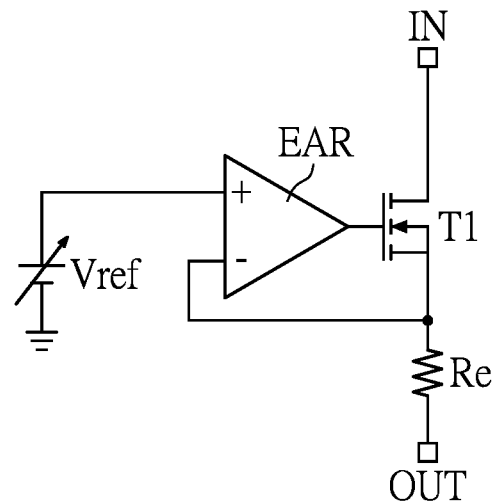
FIG. 6 is a circuit layout diagram of a current controlling device of a power converter having a slew rate controlling mechanism according to a sixth embodiment of the present disclosure.

Reference is made to FIG. 6, which is a circuit layout diagram of a current controlling device of a power converter having a slew rate controlling mechanism according to a sixth embodiment of the present disclosure.

In the embodiment, the current controlling device (such as the current controlling device CCD shown in FIG. 1, the first current controlling device CCD1 shown in FIG. 10 or FIG. 11, or the second current controlling device CCD2 shown in FIG. 11) of the power converter may include an error amplifier EAR, a transistor T1 and a resistor Re as shown in FIG. 6. For example, the transistor T1 may be a field effect transistor (FET), but the present disclosure is not limited thereto.

A first terminal of the transistor T1 may be as the input terminal IN of the current controlling device. The first terminal of the transistor T1 shown in FIG. 6 may be connected to the power output terminal of the high-side buffer BF1 shown in FIG. 1, or be coupled to the common voltage VCC shown in FIG. 10 or FIG. 11.

A first input terminal (such as a non-inverting input terminal) of the error amplifier EAR may be coupled to a reference voltage. A second input terminal (such as an inverting input terminal) of the error amplifier EAR may be connected to a node between a second terminal of the transistor T1 and a first terminal of the resistor Re. An output terminal of the error amplifier EAR may be connected to a control terminal of the transistor T1. In the embodiment, the reference voltage is a variable voltage, but the present disclosure is not limited thereto. In practice, the reference voltage may be a fixed voltage.

The second terminal of the transistor T1 may be connected to the first terminal of the resistor Re. A second terminal of the resistor Re may be as the output terminal OUT of the current controlling device. That is, the second terminal of the resistor Re may be connected to the node LX between the second terminal of the high-side switch UG and the first terminal of the low-side switch LG as shown in FIG. 1, or be connected to the power input terminal of the high-side buffer BF1 shown in FIG. 10 or FIG. 11.

Seventh Embodiment

Figure 7:
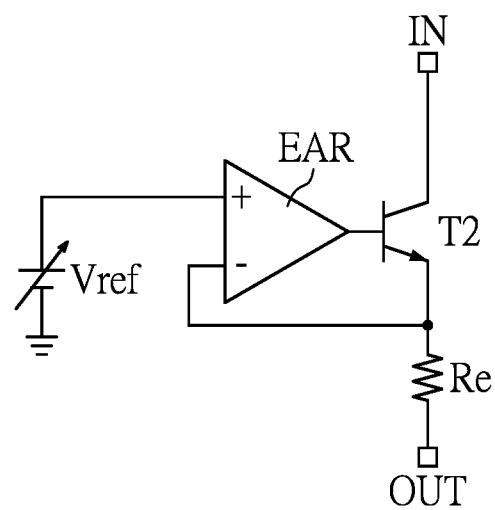
FIG. 7 is a circuit layout diagram of a current controlling device of a power converter having a slew rate controlling mechanism according to a seventh embodiment of the present disclosure.

Reference is made to FIG. 7, which is a circuit layout diagram of a current controlling device of a power converter having a slew rate controlling mechanism according to a seventh embodiment of the present disclosure.

Descriptions of the seventh embodiment that are similar to those of the sixth embodiment are not repeated herein. A difference between the sixth and seventh embodiments is that, a transistor T2 included in the current controlling device (such as the current controlling device CCD shown in FIG. 1, the first current controlling device CCD1 shown in FIG. 10 or FIG. 11, or the second current controlling device CCD2 shown in FIG. 11) of the power converter of the seventh embodiment is a bipolar transistor, but the present disclosure is not limited thereto.

Figure 8:
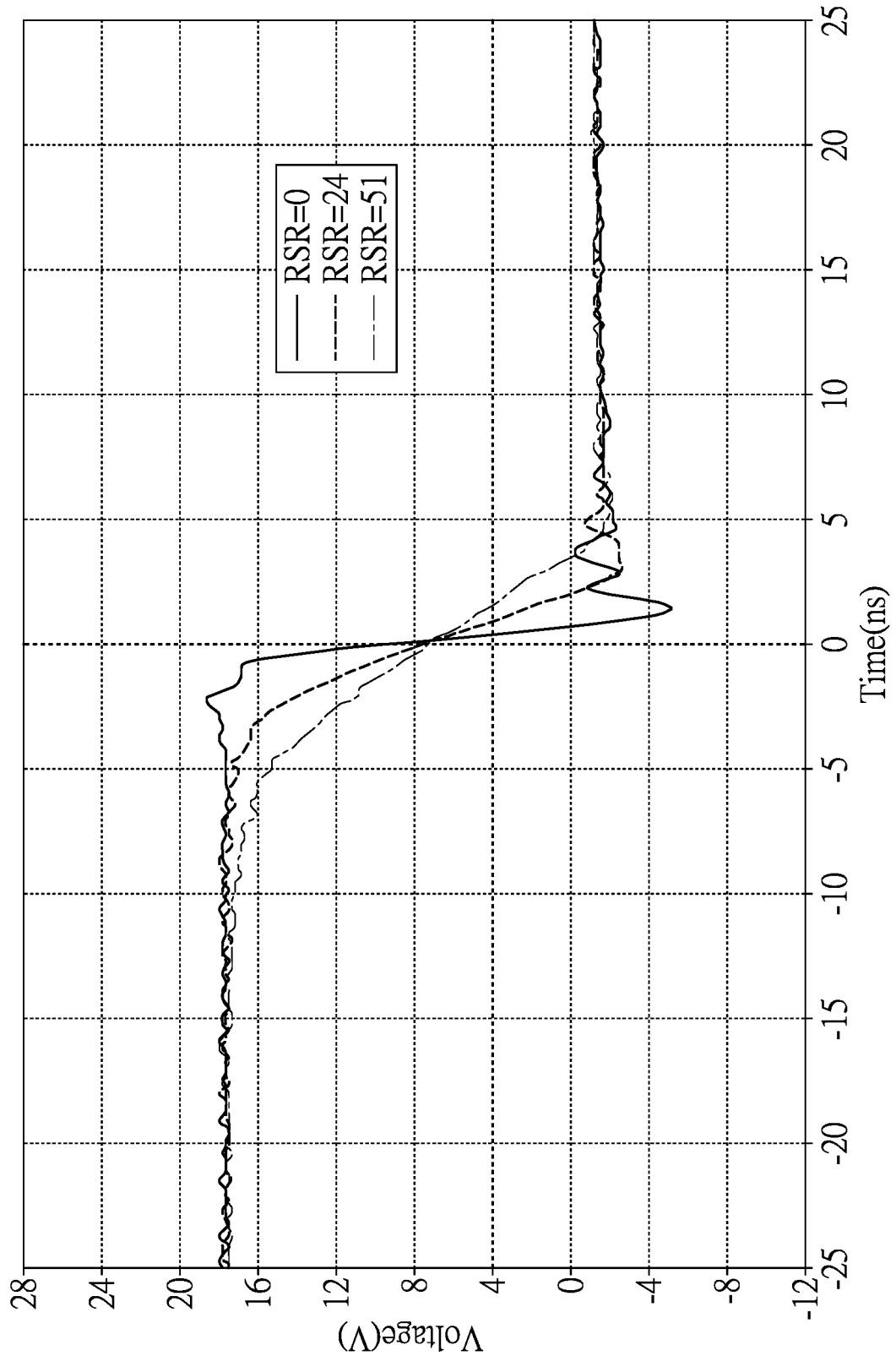
FIG. 8 is a waveform diagram of a voltage signal of a node between a high-side switch and a low-side switch of the current controlling device of the power converter having the slew rate controlling mechanism according to the first to seventh embodiments of the present disclosure.
Figure 9:
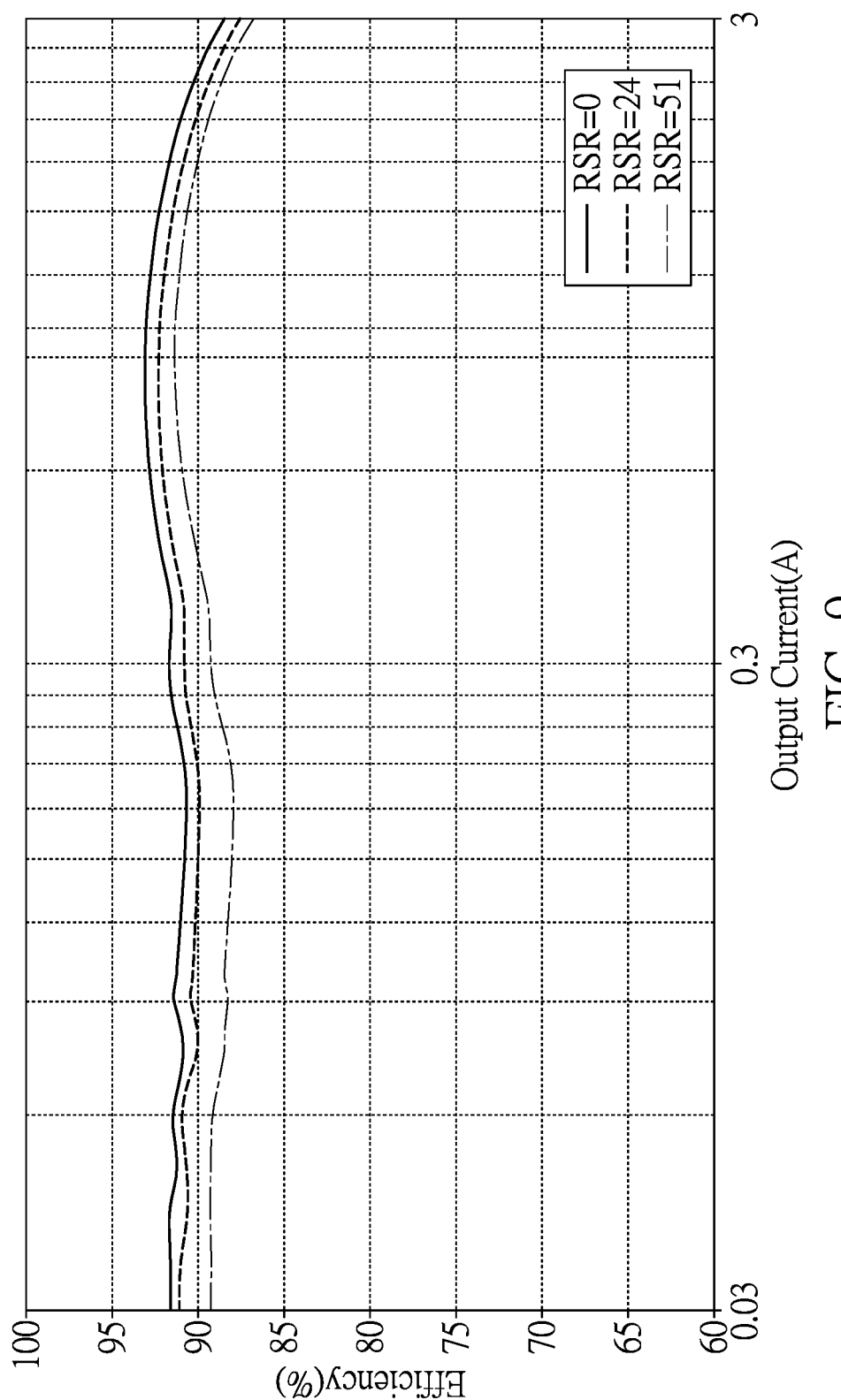
FIG. 9 is a schematic diagram of a curve of an efficiency of the power converter versus a current outputted by the power converter having the slew rate controlling mechanism according to the first to seventh embodiments of the present disclosure.

Reference is made to FIGS. 8 and 9, in which FIG. 8 is a waveform diagram of a voltage signal of a node between a high-side switch and a low-side switch of the current controlling device of the power converter having the slew rate controlling mechanism according to the first to seventh embodiments of the present disclosure, and FIG. 9 is a schematic diagram of a curve of an efficiency of the power converter versus a current outputted by the power converter having the slew rate controlling mechanism according to the first to seventh embodiments of the present disclosure.

The resistance provided by the current controlling device shown in FIG. 2 to FIG. 7 may be adjusted according to actual requirements. For example, the current controlling device may provide the resistance of 24Ω or 51Ω, but the present disclosure is not limited thereto. In contrast, a conventional power converter does not include any current controlling device configured to provide resistors.

As shown in FIG. 8, the conventional power converter does not provide any resistance. That is, the resistance of the conventional power converter is 0Ω. As a result, in the conventional power converter, the voltage signal of the node between the high-side switch and the low-side switch decreases rapidly.

The current controlling device CCD of the power converter of the present disclosure may provide different resistances according to practical requirements. For example, the current controlling device CCD may provide the resistance of 24Ω or 51Ω, but the present disclosure is not limited thereto. The larger the resistance provided by the current controlling device CCD is, the slower a drop rate of the voltage signal of the node LX between the high-side switch UG and the low-side switch LG as shown in FIG. 1 is, and the lower a noise of the power converter is.

However, as shown in FIG. 9, an operating efficiency of the power converter is affected by the resistance provided by the current controlling device of the power converter. Therefore, the resistance provided by the current controlling device should be determined according to practical requirements.

For example, when an electronic device transmits signals wirelessly, the current controlling device may provide a larger resistance to reduce the noise of the power converter. In contrast, when the electronic device enters a standby mode or other modes in which the electronic device does not need to perform operations such as transmitting the signals, the current controlling device provides a lower resistance such that the operating efficiency of the power converter is improved and a time during which the electronic device is in the standby mode can be extended.

Eighth Embodiment

Reference is made to FIG. 10, which is a circuit layout diagram of a power converter having a slew rate controlling mechanism according to an eighth embodiment of the present disclosure.

In the embodiment, the power converter having the slew rate controlling mechanism may include a high-side switch UG2, the low-side switch LG, the inductor L, the capacitor C, the high-side buffer BF1, the low-side buffer BF2, and the first current controlling device CCD1. Descriptions of the eighth embodiment that are similar to those of the previous embodiments are not repeated herein. In the embodiment, the high-side switch UG2 may be a p-channel metal oxide semiconductor field effect transistor (PMOS).

A first terminal of the high-side switch UG2 may be coupled to an input voltage. A second terminal of the high-side switch UG2 may be connected to the first terminal of the low-side switch LG. The second terminal of the low-side switch LG is grounded. The first terminal of the inductor L may be connected to the node LX between the second terminal of the high-side switch UG2 and the first terminal of the low-side switch LG. The first terminal of the capacitor C may be connected to the second terminal of the inductor L. The second terminal of the capacitor C is grounded.

The signal input terminal of the high-side buffer BF1 may be connected to the output terminal of the driver circuit. The signal output terminal of the high-side buffer BF1 may be connected to a control terminal of the high-side switch UG2. The power output terminal of the high-side buffer BF1 is grounded. The output terminal OUT of the first current controlling device CCD1 may be connected to the power input terminal of the high-side buffer BF1. The input terminal IN of the first current controlling device CCD1 may be coupled to the common voltage VCC.

The input terminal IN of the first current controlling device CCD1 may receive the common voltage VCC. The first current controlling device CCD1 may slowly supply a common current to the power input terminal of the high-side buffer BF1 based on the common voltage VCC, such that a voltage of the power input terminal of the high-side buffer BF1 slowly increases. As a result, the high-side switch UG2 is switched from an on state to an off state at a low speed such that the noise of the power converter is low.

Ninth Embodiment

Reference is made to FIG. 11, which is a circuit layout diagram of a power converter having a slew rate controlling mechanism according to a ninth embodiment of the present disclosure. Descriptions of the ninth embodiment that are similar to those of the previous embodiments are not repeated herein.

A difference between the eighth and ninth embodiments is that, the power converter of the ninth embodiment further includes the second current controlling device CCD2. The second current controlling device CCD2 may be disposed between the high-side buffer BF1 and ground. The input terminal IN of the second current controlling device CCD2 may be connected to the power output terminal of the high-side buffer BF1. The output terminal OUT of the second current controlling device CCD2 may be grounded. The power output terminal of the high-side buffer BF1 may be grounded through the second current controlling device CCD2. As a result, a voltage of a control terminal of the high-side buffer BF1 is pulled down to a zero value such that the high-side switch UG2 is switched from an off state to an on state. After the high-side buffer BF1 is turned on for a period of time, the high-side buffer BF1 is switched from the on state to the off state by the first current controlling device CCD1 as described above.

In summary, the present disclosure provides the power converter having the slew rate controlling mechanism, which includes the current controlling device that can provide different resistances according to different actual requirements. As a result, a slew rate of a falling edge of each of waveforms of the voltage signal of the node between the second terminal of the high-side switch and the first terminal of the low-side switch can be adjusted, or a slew rate of the control terminal of the high-side switch can be adjusted. Therefore, a noise of the power converter can be reduced to a desired noise level, and the power converter can operate at a desired efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a slew rate controlling mechanism, comprising:
   a high-side switch, wherein a first terminal of the high-side switch is coupled to an input voltage;
   a low-side switch, wherein a first terminal of the low-side switch is connected to a second terminal of the high-side switch, and a second terminal of the low-side switch is grounded;
   a first capacitor having a first terminal and a second terminal, wherein the second terminal of the first capacitor is connected to a node between the second terminal of the high-side switch and the first terminal of the low-side switch;
   an inductor, wherein a first terminal of the inductor is connected to the second terminal of the first capacitor, and is connected to the node between the second terminal of the high-side switch and the first terminal of the low-side switch;
   a second capacitor, wherein a first terminal of the second capacitor is connected to a second terminal of the inductor, and a second terminal of the second capacitor is grounded;
   a high-side buffer, wherein a signal input terminal of the high-side buffer is connected to an output terminal of a driver circuit, a signal output terminal of the high-side buffer is connected to a control terminal of the high-side switch, and a power input terminal of the high-side buffer is connected to the first terminal of the first capacitor and coupled to a common voltage; and
   a current controlling device, wherein an input terminal of the current controlling device is connected to a power output terminal of the high-side buffer, and an output terminal of the current controlling device is connected to the node between the second terminal of the high-side switch and the first terminal of the low-side switch.

2. The power converter according to claim 1, further comprising:
a resistor, wherein a first terminal of the resistor is connected to the power input terminal of the high-side buffer and coupled to the common voltage, and a second terminal of the resistor is connected to the first terminal of the first capacitor.

3. The power converter according to claim 1, further comprising:
a diode, wherein an anode of the diode is coupled to the common voltage, and a cathode of the diode is connected to the power input terminal of the high-side buffer.

4. The power converter according to claim 1, further comprising:
a low-side buffer, wherein a signal input terminal of the low-side buffer is connected to the output terminal of the driver circuit, and a signal output terminal of the low-side buffer is connected to a control terminal of the low-side switch.

5. The power converter according to claim 1, wherein the current controlling device includes a resistor, a first terminal of the resistor is used as the input terminal of the current controlling device, and a second terminal of the resistor is used as the output terminal of the current controlling device.

6. The power converter according to claim 1, wherein the current controlling device includes a plurality of resistors connected to each other in series, a terminal of one of the plurality of resistors is used as the input terminal of the current controlling device, and a terminal of another one of the plurality of resistors is used as the output terminal of the current controlling device.

7. The power converter according to claim 1, wherein the current controlling device includes a plurality of resistors connected to each other in parallel, a first terminal of each of the resistors is used as the input terminal of the current controlling device, and a second terminal of each of the resistors is used as the output terminal of the current controlling device.

8. The power converter according to claim 1, wherein the current controlling device includes a plurality of resistors and a plurality of switch components, a first terminal of each of the resistors is used as the input terminal of the current controlling device, second terminals of the resistors are respectively connected to first terminals of the switch components, and a second terminal of each of the switch components is used as the output terminal of the current controlling device.

9. The power converter according to claim 8, wherein the current controlling device further includes a resistor controller connected to a control terminal of each of the plurality of switch components and configured to control each of the plurality of switch components.

10. The power converter according to claim 1, wherein the current controlling device includes an error amplifier, a transistor and a resistor;
wherein a first terminal of the transistor is used as the input terminal of the current controlling device, a second terminal of the transistor is connected to a first terminal of the resistor, a second terminal of the resistor is used as the output terminal of the current controlling device, a first input terminal of the error amplifier is coupled to a reference voltage, a second input terminal of the error amplifier is connected to a node between the second terminal of the transistor and the first terminal of the resistor, and an output terminal of the error amplifier is connected to a control terminal of the transistor.

11. A power converter having a slew rate controlling mechanism, comprising:
a high-side switch, wherein a first terminal of the high-side switch is coupled to an input voltage;
a low-side switch, wherein a first terminal of the low-side switch is connected to a second terminal of the high-side switch, and a second terminal of the low-side switch is grounded;
an inductor, wherein a first terminal of the inductor is connected to a node between the second terminal of the high-side switch and the first terminal of the low-side switch;
a capacitor, wherein a first terminal of the capacitor is connected to a second terminal of the inductor, and a second terminal of the capacitor is grounded;
a high-side buffer, wherein a signal input terminal of the high-side buffer is connected to an output terminal of a driver circuit, a signal output terminal of the high-side buffer is connected to a control terminal of the high-side switch, and a power output terminal of the high-side buffer is grounded; and
a first current controlling device, wherein an output terminal of the first current controlling device is connected to a power input terminal of the high-side buffer, and an input terminal of the first current controlling device is coupled to a common voltage.

12. The power converter according to claim 11, further comprising:
a low-side buffer, wherein a signal input terminal of the low-side buffer is connected to the output terminal of the driver circuit, and a signal output terminal of the low-side buffer is connected to a control terminal of the low-side switch.

13. The power converter according to claim 11, wherein the first current controlling device includes a resistor, a first terminal of the resistor is used as the input terminal of the first current controlling device, and a second terminal of the resistor is used as the output terminal of the first current controlling device.

14. The power converter according to claim 11, wherein the first current controlling device includes a plurality of resistors connected to each other in series, a terminal of one of the plurality of resistors is used as the input terminal of the first current controlling device, and a terminal of another one of the plurality of resistors is used as the output terminal of the first current controlling device.

15. The power converter according to claim 11, wherein the first current controlling device includes a plurality of resistors connected to each other in parallel, a first terminal of each of the resistors is used as the input terminal of the first current controlling device, and a second terminal of each of the resistors is used as the output terminal of the first current controlling device.

16. The power converter according to claim 11, wherein the first current controlling device includes a plurality of resistors and a plurality of switch components, a first terminal of each of the plurality of resistors is used as the input terminal of the first current controlling device, second terminals of the plurality of resistors are respectively connected to first terminals of the plurality of switch components, and a second terminal of each of the plurality of switch components is used as the output terminal of the first current controlling device.

17. The power converter according to claim 11, wherein the first current controlling device includes a plurality of resistors and a plurality of switch components, a first terminal of each of the switch components is used as the input terminal of the first current controlling device, second terminals of the plurality of switch components are respectively connected to first terminals of the plurality of resistors, and a second terminal of each of the plurality of resistors is used as the output terminal of the first current controlling device.

18. The power converter according to claim 17, wherein the first current controlling device further includes a resistor controller connected to a control terminal of each of the plurality of switch components and configured to control each of the plurality of switch components.

19. The power converter according to claim 11, wherein the first current controlling device includes an error amplifier, a transistor and a resistor; wherein a first terminal of the transistor is used as the input terminal of the first current controlling device, a second terminal of the transistor is connected to a first terminal of the resistor, a second terminal of the resistor is used as the output terminal of the first current controlling device, a first input terminal of the error amplifier is coupled to a reference voltage, a second input terminal of the error amplifier is connected to a node between the second terminal of the transistor and the first terminal of the resistor, and an output terminal of the error amplifier is connected to a control terminal of the transistor.

20. The power converter according to claim 11, further comprising:
a second current controlling device disposed between the high-side buffer and a ground, wherein an input terminal of the second current controlling device is connected to the power output terminal of the high-side buffer, and an output terminal of the second current controlling device is grounded.

\* \* \* \* \*